(12) United States Patent
Haller

(10) Patent No.: US 6,217,787 B1
(45) Date of Patent: Apr. 17, 2001

(54) METHOD OF REMOVING AND/OR APPLYING CONDUCTIVE MATERIAL

(75) Inventor: Hans-Otto Haller, Niedereschach (DE)

(73) Assignee: Deutsche Thomson-Brandt GmbH, Villingen-Schwenningen (DE)

( * ) Notice: Subject to any disclaimer, the term of this patent is extended or adjusted under 35 U.S.C. 154(b) by 0 days.

(21) Appl. No.: 09/107,042

(22) Filed: Jun. 29, 1998

(30) Foreign Application Priority Data

Jul. 1, 1997 (EP) .................................................. 97110751
Nov. 11, 1997 (DE) .............................................. 197 49 832

(51) Int. Cl.$^7$ ....................................................... C25F 3/12
(52) U.S. Cl. ............................ 216/100; 216/96; 216/83; 216/57; 216/53; 205/640
(58) Field of Search ...................... 204/224 M; 205/223, 205/640, 201, 206, 214, 674; 216/13, 27, 53, 57, 83, 96, 100; 427/309; 430/278.1

(56) References Cited

U.S. PATENT DOCUMENTS

| | | | |
|---|---|---|---|
| 4,388,351 | * | 6/1983 | Sawyer .................................. 427/304 |
| 4,529,477 | * | 7/1985 | Lundberg et al. ...................... 216/17 |
| 4,991,287 | * | 2/1991 | Piatt et al. ............................... 29/840 |
| 5,114,558 | * | 5/1992 | Igor V. Kadija ................. 204/224 R |
| 5,186,796 | * | 2/1993 | Kelly et al. ...................... 204/129.35 |
| 5,804,052 | * | 9/1998 | Schneider ................................ 205/96 |
| 5,864,737 | * | 1/1999 | Obu et al. ............................. 399/176 |
| 6,051,116 | * | 4/2000 | Ichinose et al. ....................... 204/212 |

FOREIGN PATENT DOCUMENTS

| | | |
|---|---|---|
| 1222558 | 8/1966 | (DE) . |
| 2164490 | 6/1972 | (DE) ................................ H05K/3/06 |
| 4123985C2 | 1/1993 | (DE) ................................. C25D/7/00 |
| 4239538C1 | 11/1993 | (DE) ................................. C25F/3/02 |
| 4418278C1 | 4/1995 | (DE) ................................. C25D/7/00 |
| 19612555A1 | 10/1997 | (DE) ............................... C25D/17/28 |
| 0361029A1 | 4/1990 | (EP) ............................... C25D/17/00 |

OTHER PUBLICATIONS

German search report dated: May 19, 1998.*

* cited by examiner

*Primary Examiner*—Gregory Mills
*Assistant Examiner*—Rudy Zervigon
(74) *Attorney, Agent, or Firm*—Joseph S. Tripoli; Dennis H. Irlbeck

(57) ABSTRACT

We are familiar with etching printed circuit boards chemically by providing a copper board with a mask and etching copper away chemically at those points where the mask is not present. This is disadvantageous, e.g. from environmental standpoints, because the chemical liquid is increasingly enriched with copper, and, when the liquid has been used, it can no longer be employed and is also difficult to dispose of.

The invention is based on the object of providing a method of either applying or removing conductive material electrically. The inventive method of removing electrically conductive material from a printed circuit board having an etching mask, which covers the conductor structure, arranged on it is characterized by the fact that the following steps are carried out:

a) the printed circuit board, together with an electrode, is placed in an electrolytic liquid, b) voltages of different potential are applied to the printed circuit board and the electrode, and c) electrically conductive material is removed from the printed circuit board.

4 Claims, 3 Drawing Sheets

METHOD OF REMOVING AND/OR APPLYING CONDUCTIVE MATERIAL

FIELD OF THE INVENTION

The invention is based on a method of removing and/or applying conductive material in accordance with the pre-characterizing clause of the independent claims.

BACKGROUND OF THE INVENTION

We are familiar with etching printed circuit boards chemically by providing their copper layer with an etching mask and etching copper away chemically at those points where the etching mask is not present. This is disadvantageous, e.g. from environmental standpoints, because the chemical liquid is, in addition, enriched with copper, and, when the liquid has been used, it cannot be purified again, or can be purified only with a large input of energy and resources, and is also difficult to dispose of.

In addition, we are familiar with depositing metal layers on metal surfaces electrically in order to adapt their properties to specific requirements.

The invention is based on the object of providing a method of either applying conductive material to an insulating support or removing it from the latter electrically. This object is achieved by the invention disclosed in the independent claims. Advantageous developments of the invention can be found in the subclaims.

SUMMARY OF THE INVENTION

The inventive method of removing electrically conductive material from a printed circuit board having an etching mask, which covers the conductor structure, arranged on it, and in which the desired conductor structure allows non-cohesive areas to form, is characterized by the fact that the following steps are carried out:

a) the printed circuit board, together with an electrode, is placed in an electrolytic liquid, b) voltages of suitable different potential are applied to the printed circuit board and the electrode, and c) electrically conductive material is removed from the printed circuit board.

In this case, it is advantageous that no chemical means are used, but instead etching is carried out by electrolysis. The electrically conductive material is preferably copper and is removed from the board by the potential difference between the cathode and the anode, and is deposited on the cathode. The electrolyte is used so that a conductive connection is produced between the board, which forms the anode, and the electrode, which forms the cathode. The conductive connection is to be understood such that the different potentials cause the Cu and $So_4$ ions to migrate in the electrolyte so that they reach the negatively charged cathode. The electrolyte is an aqueous copper sulphate solution, for example.

In addition, the method can be characterized in that the printed circuit board passes through a first zone containing only the electrolytic liquid and the electrode, and in that the printed circuit board passes through a second zone containing, in addition to the electrolytic liquid and the electrode, a brush which is at the same potential as the printed circuit board, and in that, on passing through the second zone, a large area electrical contact is made with all regions of the printed circuit board.

Passing through the two zones has the advantage that copper is removed over a large area in the first zone and, in the second zone, the remnants are removed which have formed in the shape of an island. The shape of an island should be understood as meaning that not all the copper has been removed. As there is then no direct contact with the positive voltage either, this island is not removed as such. By passing through the second zone with the brushes, this is again possible, however, because the bristles of the brushes convey the positive voltage to the island surface, there is thus a potential difference between the anode and the cathode again, and the island can then be removed. The bristles of the brushes should be produced from a chemically very resistant material in order to ensure good contact and a long life.

In addition, the method can be characterized in that the printed circuit board is initially located outside the electrolyte and is introduced into the bath during the process as etching progresses, and/or in that an insulation layer is inserted between the electrode and the printed circuit board, and in that a border zone is thus obtained between the electrode and the printed circuit board.

Furthermore, the method can be characterized in that a linear electrode is moved past the printed circuit board at a short distance, which forms a moving etching zone on the printed circuit board.

It is advantageous that the brushes do not have to be used while producing the border zone. The border zone produces a potential difference over a large area at a particular point, so that island formation is virtually precluded here. The same result is obtained if the electrode is designed as a rod. In this case, the potential difference is then also increased for a particular region, so that the copper is removed.

A printed circuit board produced using the method is characterized by the fact that the conductive material which was covered by the etching mask remains on the printed circuit board.

The inventive method of applying electrically conductive material to a printed circuit board having the conductor structure mapped on it is characterized by the fact that a brush and an electrode are placed in an electrolytic liquid and a different potential is applied to the brush and the electrode, the printed circuit board, which has been seeded beforehand, is moved along underneath the brushes and there is direct contact with the brushes, and electrically conductive material is applied to the printed circuit board.

The electrode is preferably designed as a copper electrode and forms the anode, since the positive voltage is applied. The brushes are provided with a negative voltage and form the cathode. The boards are seeded with palladium, i.e. the conductor tracks which are to be covered with copper are activated in this manner. If the voltage is now applied via the brushes to the surface seeded with palladium, ions detach themselves from the anode and implant themselves in the surfaces seeded with palladium. This is how the copper conductor track layer is obtained. As a result of the fact that the board passes through a number of brushes and there is constant contact between the brush and the conductor track, ions will also continue to flow from the positive anode in the direction of the copper conductor track and be deposited there. An advantage of this is that it uses only that copper which is really needed.

Furthermore, the method can be characterized in that, after the printed circuit board has been removed from the electrolytic liquid, the potential of the electrode and the brush are interchanged and the conductive material is passed from the brush back to the electrode.

As the copper is deposited on the board, on the one hand, but also on the brushes, on the other, reversing the polarity of the anode and the cathode ensures that the copper migrates from the brushes in the direction of the electrode.

A printed circuit board produced using the method is characterized by the fact that conductive material is applied at those points corresponding to the mapped conductor structure.

The inventive method of applying and removing conductive material to and from a previously activated printed circuit board is characterized by the fact that a) a brush and an electrode are placed in an electrolytic liquid, voltages of different potential are applied to the brush and the electrode, the printed circuit board is moved along underneath the brushes and there is direct contact with the brushes, and a thin layer of electrically conductive material is applied to the printed circuit board, b) there is no brush arranged between the electrode and the printed circuit board in the electrolytic liquid, and a thick conductive layer is applied at those points where there is no etching mask, and c) a brush and an electrode are placed in an electrolytic liquid, voltages of different potential are applied to the brush and the electrode, the printed circuit board is moved along underneath the brushes and there is direct contact with the brushes, and a thin layer of electrically conductive material is removed from the printed circuit board.

Three steps are carried out in this method according to the invention. Firstly, an entirely copper layer of approximately 1–5 µm is applied on the board. In the next step, the copper on the surfaces where there is no etching mask, which was applied at the beginning of this step, is reinforced by approximately 30–40 µm. In the last step, a layer 1–5 µm thick is removed over a large area, so that the conductors comrpise layers which are approximately 30–40 µm thick, and there is otherwise no other conductive material between the individual conductors. This method is employed with relatively little loss, since the copper is either on the board or on the electrode.

A printed circuit board produced using the method is characterized by the fact that conductive material is applied at those points corresponding to the mapped conductor structure.

The inventive device for removing conductive material from a printed circuit board having an etching mask, which covers the conductor structure, arranged on it, is characterized by the fact that an electrolytic liquid contains an electrode which is connected to a first terminal of a voltage source and forms the cathode, and by the fact that the printed circuit board is in contact with a second terminal of the voltage source, and the printed circuit board thus forms the anode.

In addition, the device can be characterized by the fact that two zones are established.

The device can also be characterized by the fact that the first zone between the electrode and the printed circuit board contains only the electrolytic liquid, and by the fact that the second zone between the electrode and the printed circuit board contains a brush in the electrolytic liquid.

In addition, the device can be characterized by the fact that the brush is connected to the second terminal of the voltage source, and means are provided which guide the printed circuit board along underneath the brush in such a manner that there is direct contact with the printed circuit board.

Next, the device can be characterized by the fact that an insulation layer is arranged between the electrode and the printed circuit board in such a manner that a border zone is formed between the electrode and the printed circuit board.

The device can also be characterized by the fact that the electrode is designed as a planar electrode, round electrode or angular electrode.

The inventive device for applying conductive material to a printed circuit board having the conductor structure mapped or covered on it is characterized by the fact that a brush and an electrode are arranged in an electrolytic liquid, voltages of different potential are applied to the brush and the electrode, and means are provided which guide the printed circuit board along underneath the brush in such a manner that there is direct contact with the printed circuit board.

The inventive device for applying and removing conductive material to and from a printed circuit board having the conductor structure mapped or covered on it is characterized by the fact that a) an electrolytic liquid contains an electrode which is connected to a first terminal of a voltage source and forms the anode, by the fact that the electrolytic liquid contains a brush which is connected to a second terminal of the voltage source and thus forms the cathode, b) there are no brushes arranged between the electrode and the printed circuit board in the electrolytic liquid, and a thick conductive layer is applied at those points where there is no etching mask, c) by the fact that an electrolytic liquid contains an electrode which is connected to the first terminal of a voltage source and forms the cathode, by the fact that the electrolytic liquid contains a brush which is connected to the second terminal of the voltage source and thus forms the anode.

Island formation in the etching method can also be avoided by appropriately structuring the layout, e.g. by etching away only the contours of the island and deliberately keeping the island itself, which normally has no function. The width of the etched zone can thus be approximately 0.5 to 1 mm. Another advantage of this method is that less current is required, and therefore less power as well.

BRIEF DESCRIPTION OF THE DRAWINGS AND DETAILED DESCRIPTION OF PREFERRED EMBODIMENTS

The invention is explained below using a number of exemplary embodiments with reference to the drawing, in which.

Figure 1A:
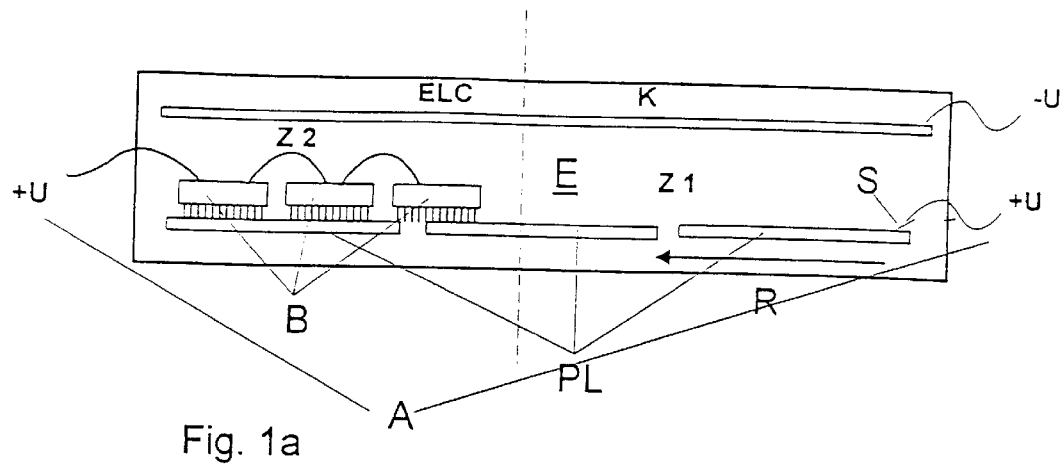
FIG. 1 shows a dual-zone technique with brushes.

FIG. 1a shows an electrode ELC which is connected as a cathode K, i.e. is connected to the voltage −U. In addition, it shows brushes B and boards PL. The board PL represents the printed circuit board. The brushes B and the boards PL are connected to the voltage +U and form the anode A. The cathode K and the anode A are in an electrolytic liquid E. In addition, two zones Z1 and Z2 are illustrated, which are explained later. A slider S is used to make contact between the voltage source +U and the board PL. It is also possible to use a moving power supply line instead of the slider. The method works as follows. The board PL is pushed in the direction R along the cathode K. The board PL is at a uniform distance from the cathode K. The potential difference and the electrolytic liquid E now cause electrolytic etching to take place. This means that the conductor tracks which are not covered by an etching mask are removed.

Figure 1B:
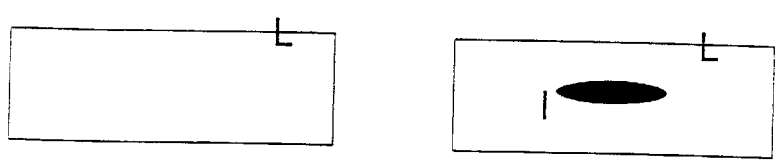

The non-uniform current distribution, on account of the sizeable electrode, can cause island formation, as shown in FIG. 1b. This means that all but a small portion of the copper layer has been removed. Since the slider S is no longer in contact with the small residual part 1, there is no longer any current flow and the copper coating would no longer be completely removed. For this reason, on leaving zone 1, one or more brushes in zone 2 will ensure that the voltage +U is applied to the remaining islands I, so that they can be removed. The brushes are used for making contact over the surface, and removal of the islands is additionally assisted by direct contact with the free metal surface and the movement of the printed circuit board in the direction R. The brushes are made of highly resistant noble metal, e.g. platinum, iridium or the like. The copper Cu removed settles on the cathode K and can thus be reused later or recycled as copper. In addition, it should be noted that the cathode K is designed to be large enough for it to cover the surfaces of all the boards.

Figure 2:
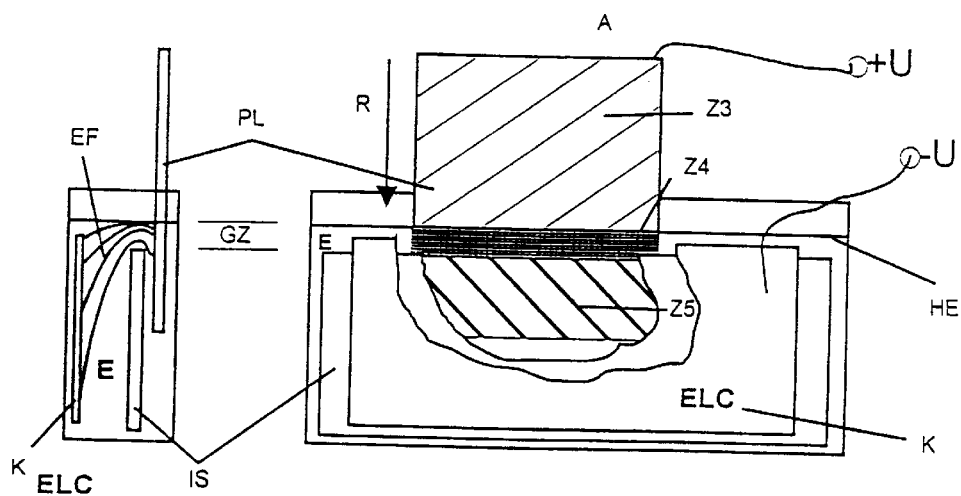
FIG. 2 shows an insulation layer between the anode and the cathode.

FIG. 2 shows a further exemplary embodiment without the brushes shown in FIG. 1. The conductor is in this case illustrated as a cathode K and the printed circuit board as a board PL. This was also the case in FIG. 1. The insulation layer IS between the cathode K and the board PL is arranged such that a border zone GZ is obtained. The electrical field lines EF formed between the cathode K and the board PL are also shown. The cathode K is connected to the negative voltage −U and the board PL is connected to the positive voltage +U. The board PL forms the anode. The zone Z3 is the zone which has not been etched. The zone Z4 is the zone which is being etched at the moment. The zone Z5 is the zone which has already been etched. HE indicates the liquid level of the electrolyte. If the board PL is now moved in the direction R, electrolytic etching takes place in the border zone GZ. This means that those parts of the board PL which are not covered by the etching mask are removed. The copper precipitates on the cathode K. Island formation is prevented by the formation of the border zone GZ and the concentration of the electric field at that point.

Figure 3:
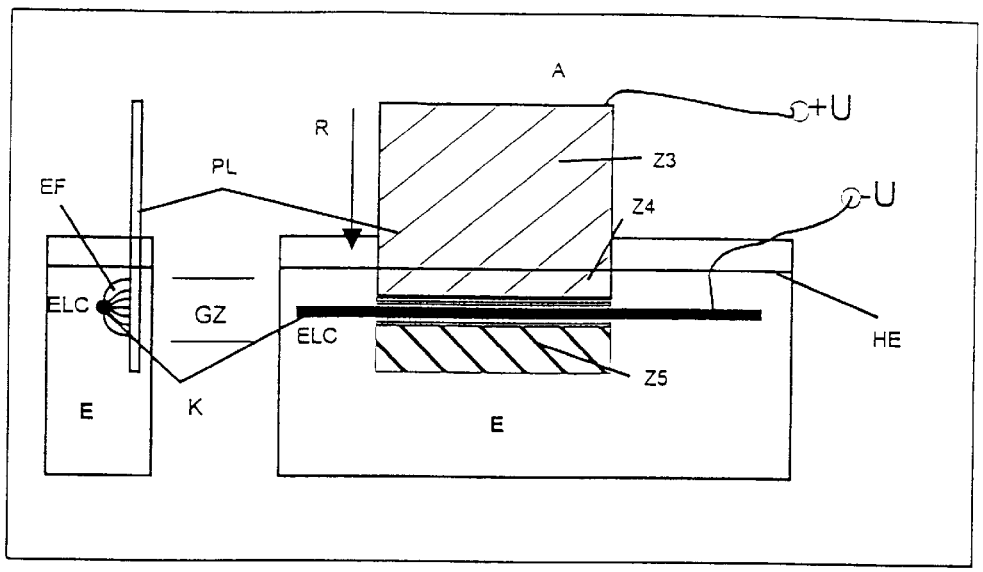
FIG. 3 shows a round electrode.

FIG. 3 shows a development of the exemplary embodiment shown in FIG. 2. In this case, the border layer GZ is obtained by using a rod electrode having a round cross-section. The abbreviations in FIG. 3 have the same meaning as in FIG. 2. It is also possible to use a triangular or polygonal electrode instead of the round electrode, in order to obtain corresponding field lines. Instead of moving the printed circuit board, it is also possible in this case to move the cathode past the stationary printed circuit board. It is also possible to arrange the cathode vertically.

In FIGS. 1–3, the copper has already been removed from the board in each case.

Figure 4A:
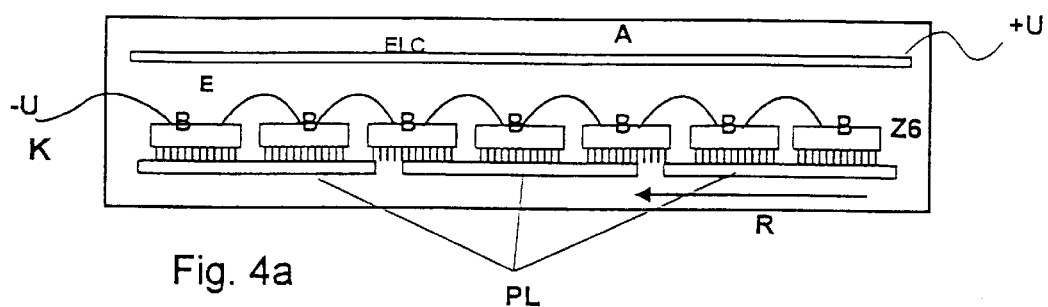
FIG. 4 shows a brush technique with conductive material being applied.
Figure 4B:
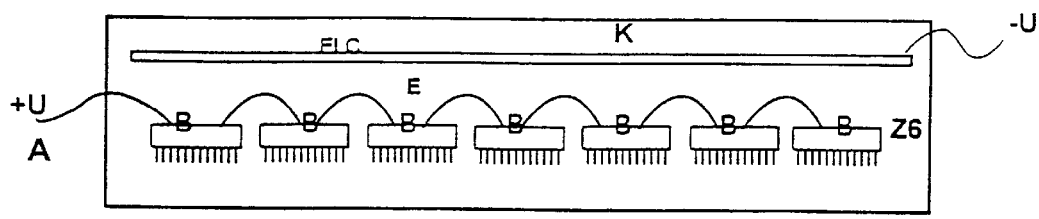

FIG. 4 shows an exemplary embodiment in which the copper is to be applied at particular points. The electrode is represented by the anode A. The anode is a copper anode. The anode is connected to the voltage +U. The boards are pushed along in the direction R at a constant distance from the anode A. The brushes B are in direct contact with the boards P1 and are connected to the voltage −U and form the cathode K. The board is seeded with palladium. This causes the surface to become conductive at the seeded points. The board is seeded with palladium such that the conductor structure is mapped. If the conductor structure is now supplied with the negative voltage −U via the brushes, the electrolyte E causes the copper to be transferred to the seeded surface from the anode A. This method precipitates the copper electrochemically and forms the conductor tracks. When a number of boards have been produced using the method, the polarity of the voltage on the conductor and the brushes is reversed, so that the copper which has previously precipitated on the brushes can be transferred from the brushes to the conductor again. As shown in FIG. 4b, this means that the copper is transferred from the brushes B, which now have the voltage +U applied to them, which thus forms the anode, to the electrode which is now the cathode K and has a voltage −U applied to it.

Figure 5A:
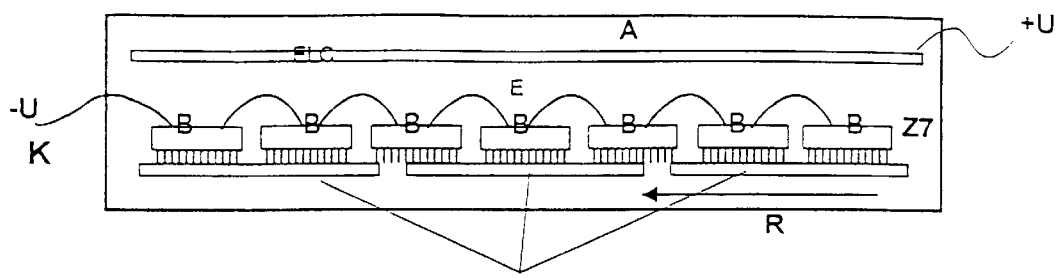
FIG. 5 shows a brush technique with conductive material being applied and removed.
Figure 5B:
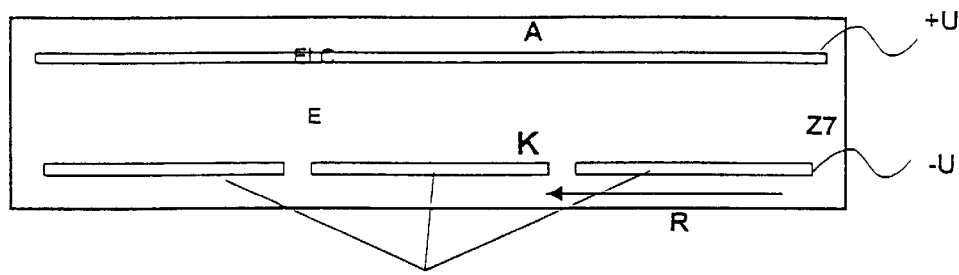

FIG. 5 shows another exemplary embodiment. The same reference symbols are used as in FIG. 4. In FIG. 5a, a copper layer having a thickness of approximately 3 $\mu$m is applied over the whole surface. In FIG. 5b, the boards are provided with an etching mask, i.e. in this case, however, the copper is reinforced by approximately 35 $\mu$m at those points where the etching mask is not present. This means that the whole board has a copper layer of 3 $\mu$m, and the conductor tracks have an additional copper layer of 35 $\mu$m, so that the conductor tracks have a total thickness of 38 $\mu$m.

Figure 5C:
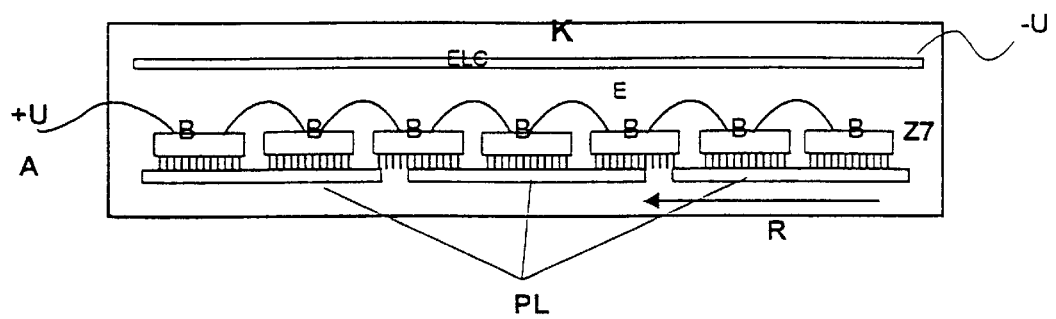

In FIG. 5c, the electrode ELC and the board PL are supplied with different voltages from those in FIGS. 5a and b. This means that the electrode now becomes the cathode K with the voltage −U. The brushes B are connected to the voltage +U and form the anode A. The etching mask is removed beforehand. By reversing the voltages, a thickness of 3 $\mu$m is now removed from the copper so that only the conductor tracks still remain, which had a greater thickness of 38 $\mu$m in total, which has now been reduced to 35 $\mu$m.

In summary, a thin copper layer is applied over the whole surface in FIG. 5a. In FIG. 5b, a copper layer is applied or cultivated at those points which are intended to have conductor tracks. In FIG. 5c, a thin layer is removed uniformly, so that only the conductor track pattern is preserved. This procedure appears to be complicated at first, but is advantageous in the terms of process engineering because it also produces no island formation, and there is virtually no loss of material. This means that the material required is transformed into conductor tracks.

The electrolyte E should be circulated so that differences in concentration are avoided, and this assists the etching process.

What is claimed is:

1. Method of etching electrically conductive material (KU) from a printed circuit board (PL) having a mask, which covers the conductor structure, arranged on it, characterized by the following steps:
    a) the printed circuit board (PL), together with an electrode (ELC), is placed in an electrolytic liquid (E),
    b) voltages (+U; −U) of different potential are applied to the printed circuit board (PL) and the electrode (ELC),
    c) the printed circuit board (PL) is immersed into a bath containing electrolytic liquid and passed through a first zone (Z1) of the bath, and
    d) the printed circuit board (PL) is passed throuah a second zone (Z2) of the bath where the printed circuit board is contacted by a brush (B) which is at the same potential (+U) as the printed circuit board (PL).

2. Method of depositing electrically conductive material (KU) from a printed circuit board (PL) having an etching mask, which covers the conductor structure, arranged on it, characterized by the following steps:
    a) the printed circuit board (PL), together with an electrode (ELC), is placed in an electrolytic liquid (E), b) voltages (+U; −U) of different potential are applied to the printed circuit board (PL) and the electrode c) the printed circuit board (PL) is immersed into a bath containing electrolytic liquid and passed through a first zone (Z1) of the bath, and the printed circuit board (PL) is passed through a second zone (Z2) of the bath where the printed circuit board is contacted by a brush (B) which is at the same potential (+U) as the printed circuit board (PL).

3. Method according to claim 2, characterized in that, after the printed circuit board (PL) has been removed from the electrolytic liquid (E), the potential of the electrode (ELC) and the brush (B) are interchanged and the conductive material is removed from the brush (B) and redeposited onto the electrode (ELC).

4. Apparatus for electrolytical transport of conducting material between an electrode and a printed circuit board having a mask, which covers the conductor structure arranged on it wherein the apparatus comprises a bath containing electrolytical liquid characterized in that the bath is divided into a first and a second zone and in that in the second zone at least contact means is arranged apt for contacting the conductor structure on the printed circuit board and wherein the contact means is connected to the same potential as the printed circuit board.

* * * * *